United States Patent [19]

Masumoto et al.

[11] Patent Number: 4,655,079
[45] Date of Patent: Apr. 7, 1987

[54] LEVEL GAUGE FOR LIQUID HELIUM

[75] Inventors: Tsuyoshi Masumoto, Sendai; Akihisa Inoue, Kawauchi; Tetsuo Oka, Toyoake; Masami Ishii, Toyota; Hiroshi Motoyama, Toyota; Ryohei Yabuno, Toyota, all of Japan

[73] Assignee: Aisin Seiki Kabushiki Kaisha, Kariya, Japan

[21] Appl. No.: 673,931

[22] Filed: Nov. 21, 1984

[30] Foreign Application Priority Data

Nov. 22, 1983 [JP] Japan .................. 58-220076

[51] Int. Cl.⁴ ............... G01F 23/00; C22C 16/00; H01B 1/02; H01B 12/00
[52] U.S. Cl. .................. 73/295; 73/290 R; 420/901
[58] Field of Search ........ 73/304 R, 290 R, 299, 73/295; 374/176; 338/325; 148/403; 420/422, 901

[56] References Cited

U.S. PATENT DOCUMENTS

| 3,085,433 | 4/1963 | Shuveli | 73/295 |
| 3,436,713 | 4/1969 | Di Noia | 374/176 |
| 3,496,773 | 2/1970 | Cornish | 73/295 |
| 3,856,513 | 12/1974 | Chen et al. | 374/176 |
| 3,943,767 | 3/1976 | Efferson | 73/295 |
| 4,118,984 | 10/1978 | Kuraoka et al. | 73/295 |
| 4,517,253 | 5/1985 | Rose et al. | 428/684 |
| 4,564,396 | 1/1986 | Johnson et al. | 420/590 |

FOREIGN PATENT DOCUMENTS

| 93024 | 7/1980 | Japan | 73/304 R |
| 103324 | 8/1981 | Japan | 73/304 R |
| 164924 | 12/1981 | Japan | 73/295 |
| 166220 | 10/1983 | Japan | 73/295 |

OTHER PUBLICATIONS

A Device for Controlling the Operation of a Metal Helium Cryostat, by Permyakov et al, Cryogenics, 4-1972.

Primary Examiner—Charles Frankfort
Assistant Examiner—W. Morris Worth
Attorney, Agent, or Firm—Oblon, Fisher, Spivak, McClelland & Maier

[57] ABSTRACT

A level gauge for liquid helium comprising a sensing element in the form of a ribbon wire made of superconductive alloys and a tube supporting the sensing element, which tube is inserted into liquid helium upon measurement. The superconductive alloys are represented by a formula $Zr_{100-x}(Ru_y\cdot Rh_{1-y})_x$ in which x represents contents of Ru and/or Rh in atomic % and in a numerical value of $22.5 \leq x \leq 27.5$ and y represents a numerical value of $0 \leq y \leq 1$. The alloys are made of an amorphous phase obtained by rapid quenching a molten alloy material and have a superconducting transition temperature, Tc, of 4.2° to 4.5° K. When the level gauge is immersed in liquid helium, a portion of the sensing element below the level of the liquid helium has a zero electric resistance because of the superconductivity of the alloy, so that the level of the liquid helium can be detected by a variation in resistance of the sensing element.

7 Claims, 7 Drawing Figures

LEVEL GAUGE FOR LIQUID HELIUM

BACKGROUND OF THE INVENTION

1. Field of the Invention

This invention relates to a level gauge for detecting a level of liquid helium which is accomodated in a container made of metals, glasses or other materials. More particularly, the invention relates to a level gauge for detecting a level of liquid helium which makes use of, as a sensing element, a wire made of an amorphous superconductive alloy obtained by rapid quenching a molten alloy material and in which the level of liquid helium is detected by measurement of an electric resistance of the sensor element.

2. Description of the Prior Art

Masumoto and Inoue disclosed, in Japanese Patent Application No. 57-049911 filed Mar. 26, 1983 and now laid-open in Japanese Laid-open Patent Application Gazette No. 58-167739, level gauges which makes use of wires, made of amorphous superconductive alloys, as sensing elements in order to detect a level of liquid helium.

The amorphous superconductive alloys used to make the sensing elements of the level gauge are alloys which are obtained by rapid quenching molten alloy materials and which comprise 20% vol. or more of an amorphous phase and whose superconducting transition temperature, Tc, ranges from 4.2° to 5.0° K. The alloys are represented by the general formula, $Z_a.M_b.(Q+Al)_c$, in which Z is a member selected from the group consisting of Zr, Hf and Ti, M is a member selected from the group consisting of V, Nb and Ta, Q is Si or Ge, a is a value of 10 to 90 atomic %, b is a value of less than 80 atomic %, and c is a value of 10 to 25 atomic %.

The level gauge disclosed in the above patent application utilizes a wire sensing element of the superconductive alloys. The level gauge is attached to a container in such a way that the sensing element is vertically disposed into liquid helium accomodated in the container. The level of the liquid helium is detected as follows: the sensing element is connected to a D.C. power supply at opposite ends thereof and applied with a small electric current to measure a variation of an electric resistance of the element.

Of the amorphous superconductive alloys represented by the above general formula, $Z_a.M_b.(Q+Al)_c$, an alloy of $Zr_{80}.Nb_5.Al_8Si_7$ has the following problems to be solved when applied as a wire sensing element of a level gauge.

(1) Because of the addition of Nb to Zr which is a main ingredient of the superconductive alloy of the above formulation, the melting temperature of the alloy becomes very high, i.e. about 1800° C., so that specific types of equipments or apparatus are needed to melt the alloy.

(2) For the production of the alloy, production conditions such as a melting temperature, a time required for quenching and the like must be determined in detail, resulting in poor workability.

(3) It is very difficult to make a wire having a width below 0.5 mm, which is required as the sensing element of the level gauge.

(4) The superconducting transition temperature Tc, of the alloy is in the range of from 4.2° to 5.0° K. Depending on the production conditions, the temperature may vary within a range of 0.5 to 10%. Accordingly, after the alloy wires are made the individual wire must be measured with respect to the transition temperature which requires an additional selection operation.

(5) When a sensing element of the level gauge is made of an alloy whose superconducting transition temperature, Tc, is about 5.0° K., an electric current of about 50 mA is necessary for the measurement of a level of liquid helium. However, if the current for the measurement is such a high value as indicated above, evaporation of liquid helium is promoted.

SUMMARY OF THE INVENTION

A primary object of the present invention is to provide a level gauge which makes use of a sensing element made of superconductive alloys which have a superconducting transition temperature, Tc, ranging from 4.2° to 4.5° K. whereby a level of liquid helium can be detected using a smaller measuring electric current than in the case of the prior art.

Another object of the present invention is to provide a level gauge of high sensitivity by using a smaller measuring electric current which comprises, as a sensing element, a very fine wire, e.g. a ribbon wire having a thickness of 10 to 30 μm and a width of 0.2 to 0.5 mm, made of superconductive alloys.

A further object of the invention is to provide a level gauge which comprises a sensing element made of superconductive alloys which have good mechanical characteristics with respect to tensile strength, bending strength, breakage and the like and which involve only small variations in superconducting transition temperature, $T_c$ caused by production conditons.

A still further object of the invention is to provide a level gauge which comprises a sensing element made of superconductive alloys which are able to melt at temperatures below 1300° C. and which can be prepared by known melting devices such as, for example, quartz nozzles and the like.

In accordance with the present invention, there is provided a level gauge for liquid helium which comprises a sensing element constituted by a wire of a superconductive alloy which has a superconducting transition temperature, Tc, of 4.2° to 4.5° K., a support member for linear support and for dielectric insulation of the sensing element thereon, means for energizing the sensing element, and means for detecting a current passed through the sensing element, said superconductive alloy consisting essentially of zirconium, ruthenium and rhodium which are represented by a formula, $Zr_{100-x}.(Ru_y.Rh_{1-y})_x$ in which x represents contents of Ru and/or Rh in atomic percent and in numerical value of $22.5 \leq x \leq 27.5$ and y represent a numerical value of $0 \leq y \leq 1$, and said superconductive alloy having an amorphous phase which is obtained by rapid quenching of a molten alloy material.

Preferably, the sensing element is in the form of a ribbon wire having a thickness of 10 to 30 μm and a width of 0.2 to 0.5 mm and is dielectrically insulated and supported in a linear manner along the axis of a supported member, in the form of a metallic tube, over substantially the entire length thereof.

BRIEF DESCRIPTION OF THE DRAWINGS

Various other objects, features and attendant advantages of the present invention will be more fully appreciated as the same becomes better understood from the following detailed description when considered with reference to the accompanying drawings in which like characters designate like or corresponding parts and in which.

DETAILED DESCRIPTION OF THE PREFERRED EMBODIMENTS

One of the prominent features of the invention resides in that the materials used for a sensing element for detecting a level of liquid helium are superconductive alloys whose superconducting transition temperature, Tc, is from 4.2° to 4.5° K. which is almost equal to a temperature of liquid helium under an atmospheric pressure, i.e. 4.2° K. and which are represented by a formula, $Zr_{100-x} \cdot (Ru_y \cdot Rh_{1-y})_x$, in which the contents of Zr, Ru and Rh are based on atomic percent and X and Y represents a numerical number of $22.5 \leq x \leq 27.5$ and $0 \leq y \leq 1$, respectively.

The characteristics of the superconductive alloys are described below.

Figure 1:
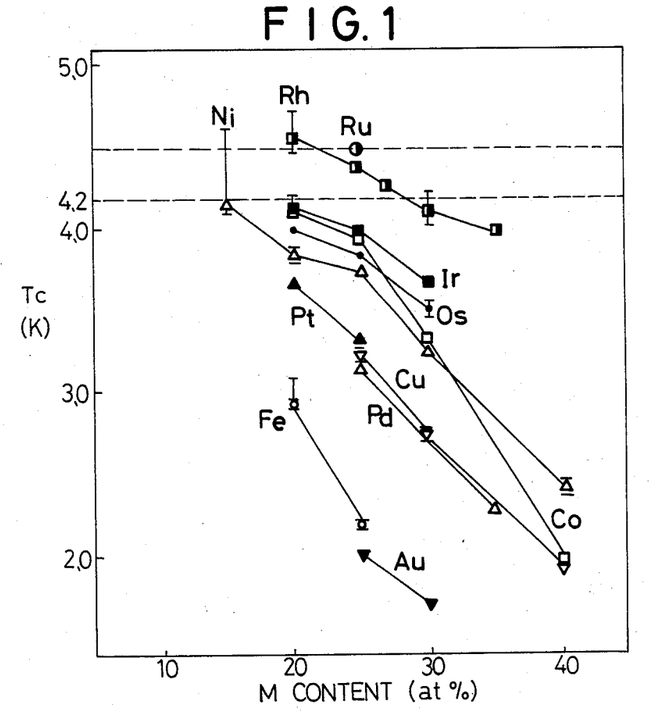
FIG. 1 is a graph showing the relationship between the superconductive transition temperature $T_c$ and the contents of an element, M, in a two-component alloy consisting essentially of zirconium as a matrix and each of various elements, M.

During the course of researches and investigations on an amorphous substance-forming range, superconductive characteristics and low temperature characteristics of amorphous superconductive materials of Zr, Nb, Ti, etc. and alloys thereof made by the present inventors, two-component alloys which comprise a Zr matrix and up to 45 atomic % of each of 11 alloy elements including Fe, Co, Ni, Cu, Ru, Rh, Pd, Os, Ir, Pt and Au were produced in order to determine an amorphous substance-forming range and superconductive characteristics of the alloys. The results are shown Table 1 and FIG. 1. In the above tests, Zr matrix and each additive element were melted, supercooled and solidified. In Table 1, the contents (by atomic %) of the additive elements are shown or selected such that the resulting alloys are amorphous. FIG. 1 is a graph showing the relation between content of each additive alloy element, M, in the above two-component alloy and superconducting transition temperature, Tc, of the two-component alloy.

TABLE 1

| | | Amorphous Substance-forming Range | | | |
|---|---|---|---|---|---|
| No. | Alloy Element | Content (atomic %) | No. | Alloy Element | Content (atomic %) |
| 1 | Fe iron | 20– | 7 | Pd palladium | 25–35 |
| 2 | Co cobalt | 20– | 8 | Os Osmium | 20– |
| 3 | Ni nickel | 15– | 9 | Ir iridium | 20– |
| 4 | Cu copper | 25– | 10 | Pt platinum | 20–25 |
| 5 | Ru ruthenium | 22.5–27.5 | 11 | Au gold | 25–35 |

TABLE 1-continued

| | | Amorphous Substance-forming Range | | | |
|---|---|---|---|---|---|
| No. | Alloy Element | Content (atomic %) | No. | Alloy Element | Content (atomic %) |
| 6 | Rh rhodium | 20– | | | |

As will be apparent from Table 1, when Fe, Co, Rh, Os and Ir are, respectively, added to the Zr matrix in amounts exceeding 20 atomic %, the amorphous phase is formed in the two-component alloys. Ni and Co are able to form the amorphous phase when added in amounts exceeding 15 atomic % and 25 atomic %, respectively. With other elements particularly Ru, the amorphous phase is formed when the content is in the range of 22.5 to 27.5 atomic %.

Then, the thus obtained two-component alloys are subjected to measurement of a superconducting transition temperature, Tc, and the relation between the temperature, Tc, and the content of each element, M, in the respective alloy is shown in FIG. 1. As will be seen from the figure, when Rh and Ru are used to produce two-component alloys with Zr, respectively, the superconducting transition temperature of such alloys is within a range of 4.2° to 4.5° K. provided that the content of Ru or Rh ranges from 22.5 to 27.5 atomic %. The transition temperature is found to be substantially equal to 4.2° K. which is a temperature of liquid helium under an atmospheric pressure. With regard to the other alloy elements including Fe, Co, Cu, Pd, Os, Ir, Pt and Au, the superconducting transition temperature, Tc, of the amorphous alloys of Zr to which each of the above elements is added is lower than 4.2° K. As for amorphous alloys of Zr, to which Ni is added, the superconducting transition begins to occur at 4.5° K. or higher when the content of Ni is 15 atomic %. The range of the transition is wide. In addition, the temperature at which the transition is completed is 4.15° K., so that nickel is unsuitable as an additive element of superconductive alloys for use as a sensing element of a level gauge according to the invention.

It is noted from the above results, that the alloys represented by the formula, $Zr_{100-x} \cdot (Ru_y \cdot Rh_{1-y})_x$ in which x represents an atomic percent and x and y are in numerical value of $22.5 \leq x \leq 27.5$ and $0 \leq y \leq 1$, respectively, have a superconducting transition temperature, Tc, ranging from 4.2° to 4.5° K. and are thus suitable as alloys which are used to form a sensing element for detecting a level of liquid helium.

The above alloys have the following advantages when used to make sensing elements.

(1) The alloys of Zr to which Ru and/or Rh is added have an eutectic point between 24 and 26 atomic %, so that the melting point of the alloy abruptly lowers to substantially 1100° C. with the content of Ru and/or Rh being within a range of 22.5 to 27.5 atomic %. Accordingly, these alloys can be readily produced in known melting devices equipped with a quartz nozzle. Thus, existing apparatus can be used without modification.

(2) Since the structure of the alloy is a single amorphous phase, good mechanical characteristics are obtained. Accordingly, the alloy can be used to form a wire for the sensing element which is very fine and has a thickness of 10 to 30 μm and a width of 0.2 to 0.5 mm. This permits easy assembly of the level gauge, and a decreased measuring electric current with little breakage being involved in handling.

(3) The superconducting transition temperature, Tc, of the alloy rarely varies according to the preparatory conditions, so that the number of defects at the time of the production is low, mass production is possible, and the level gages using sensing elements of the alloy are highly reliable with respect to measured values.

Several alloys represented by the formula, $Zr_{100-x}.(Ry_y.Rh_{1-y})_x$, are shown in Table 2 below with regard to their compositions, superconducting transition temperature, Tc, melting temperature, TM, tensile strength and specific resistance.

TABLE 2

| No. | Composition | Tc (°K.) | Melting Point TM (°C.) | Tensile (Kg/mm²) | Specific Resistance (μΩcm) |
|---|---|---|---|---|---|
| 1 | $Zr_{75}Rh_{25}$ | 4.42 | 1250 | 200 | 165 |
| 2 | $Zr_{74}Rh_{26}$ | 4.40 | 1230 | 205 | 180 |
| 3 | $Zr_{73}Rh_{27}$ | 4.22 | 1280 | 185 | 183 |
| 4 | $Zr_{75}Rh_{20}Ru_5$ | 4.44 | 1300 | 180 | 188 |
| 5 | $Zr_{75}Rh_5Ru_{20}$ | 4.47 | 1290 | 165 | 190 |
| 6 | $Zr_{75}Ru_{25}$ | 4.50 | 1280 | 190 | 192 |

Figures 2, 4, 5, 6, 7:
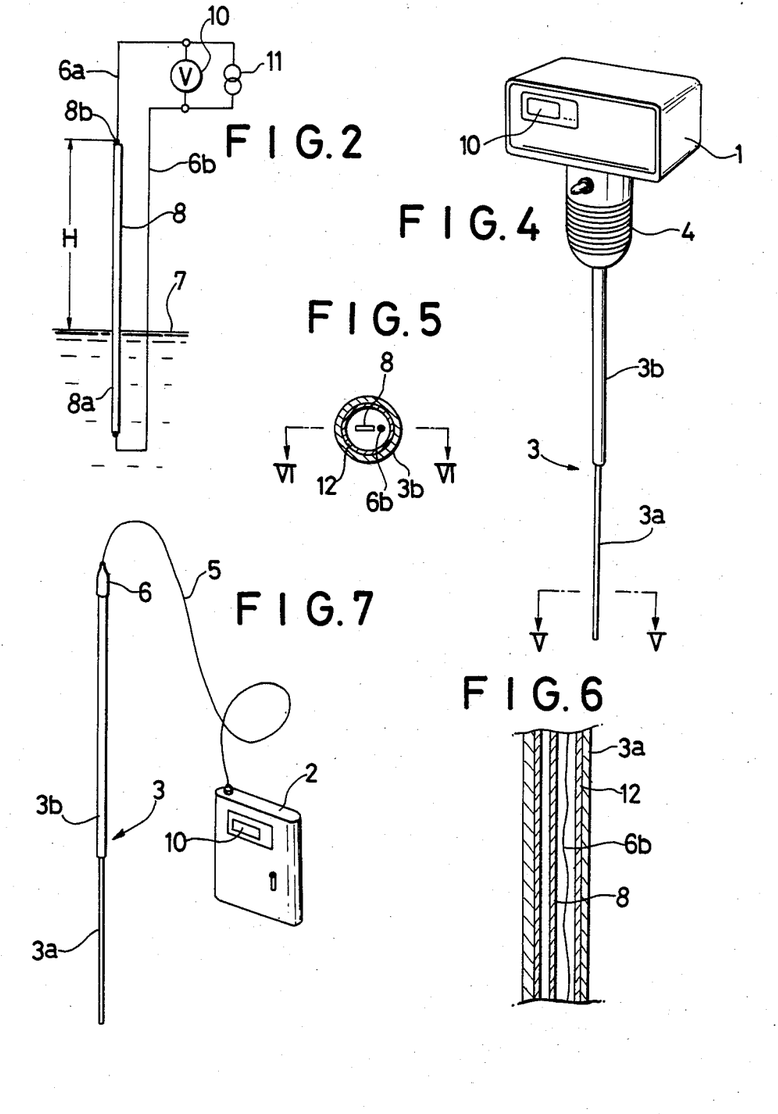
FIG. 2 is an electric current for illustrating the principle of a level gage according to the invention.
FIG. 4 is a perspective view of one embodiment according to the invention.
FIG. 5 is a sectional view taken along the line V—V of FIG. 4.
FIG. 6 is a sectional view taken along the line VI—VI of FIG. 5.
FIG. 7 is a perspective view of another embodiment according to the invention.
Figure 3:
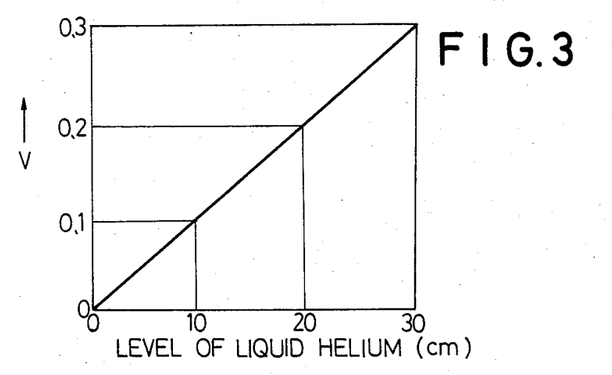
FIG. 3 is a graph showing the relation between level of liquid helium detected according to the present invention and detected voltage.

FIG. 2 shows an electric circuit for illustrating the priciple of a level gauge for detecting a level of liquid helium. FIG. 3 is a graph showing the relation between the voltage detected by the electric circuit and the level of the liquid helium.

In FIG. 2, indicated by 8 is a ribbon-shaped sensing element made of one of the superconductive alloys indicated in Table 2 and having a predetermined thickness and width within ranges of 19 to 21 μm for the thickness and 0.2 to 0.3 mm for the width, respectively. The element is supported linearly on a support member as will be described hereinafter. The sensing element 8 is connected at opposite ends thereof with electrical conductive wires 6a, 6b, each having an insulative covering. The other ends of the wires 6a, 6b are connected to a DC power circuit 11 comprising a battery, so that the sensing element 8 can be supplied with an electric current from one side to the other along the length thereof. Indicated by 10 is a voltmeter which is connected in parallel to the sensing element 8 with respect to the power circuit 11.

When an electric current of 10 mA is supplied to the sensing element 8 from the power circuit 11, the voltmeter indicates a low voltage because of the great resistance of the sensing element 8. On the other hand, when part or an entirety of the sensing element 8 is inserted into liquid helium accomodated in a container (not shown), the portion of the sensing element 8 immersed in the liquid helium effects the influence of the very low temperature of the liquid helium, so that the temperature of the portion lowers to about 4.2° K. with the remainder having a temperature not less than 4.2° K. If a level of the liquid helium is indicated as 7 in FIG. 2 and the sensing element is held vertical with respect to the level 7 of liquid helium, a portion 8a of the sensing element 8 below the level 7 of the liquid helium has a zero electric resistance of the superconductive alloy, so that the voltage indicated by the voltmeter 10 is a value proportional to an electric resistance of the superconductive alloy constituting a portion 8b which is exposed to a helium gas provided above the liquid level 7. Since the sensing element 8 is in the form of a ribbon wire having a predetermined thickness and width, a voltage indicated on the voltmeter 10 is proportional to a length, H, of the portion 8b of the sensing element 8 exposed to the helium gas and provided above the level 7. As a result, a distance ranging from a reference level of the container accomodating the liquid helium therein or the upper end of the sensing element 8 to the level 7 of the liquid helium can be measured. If the liquid helium increases or decreases, the length, H, of the portion 8b of the sensing element 8 varies. This variation is detected as a variation of voltage. When the indication of the voltmeter 10 is numerically converted, it becomes possible to indicate a height of the liquid level 7 from the bottom of the container. For instance, if an indication on the voltmeter 10 is calibrated to be zero when the overall length of the sensing element 8 is exposed to the helium gas and the sensing element is vertically disposed so that the lower end thereof can reach the bottom of the container, the height of the level of the liquid helium can be directly read from the voltmeter 10 as particularly shown in FIG. 3.

FIG. 4 shows one embodiment of a level gauge fabricated on the basis of the above principles. The level gauge includes a casing 1 having a switch box 4 fixed at the bottom of the casing 1 and formed as a cylinder for easily handling. A measuring unit 3 extend from the lower end of the switch box 4. The measuring unit 3 includes a support member 3a consisting of a metallic tube and supporting the sensing element 8 and a base member 3b having a larger diameter than the support member 3a. The support member 3a and the base member 3b are coaxially provided and fixedly secured to each other. The measuring unit 3 is fixed to the switch box 4 at one end of the base member 3b. The support member 3a has a closed lower end thereof. The support member 3a and the base member 3b each has an insulating layer 12 on the inner surface thereof as particularly shown in FIGS. 5 and 6. The support member 3a supports in the inside thereof a linear sensing element 8 through the overall length thereof along the axial directions of the support member 3a. Electrical conductive wires (6a, 6b) having an insulative covering, which are connected to opposite ends of the sensing element 8, respectively, and are passed through the measuring unit 3 and the switch box 4 to the casing 1 and connected to a power circuit 11 and a voltmeter 10 disposed in the casing 1.

In the above embodiment, the measuring unit 3 is fixed to the casing 1 and is attached, in use to the opening of a container accomodating liquid helium therein through the switch box 4 in such a way that the axis of the measuring unit 3 is arranged perpendicular to the liquid level of the liquid helium and the support member 3a of the measuring unit 3 is immersed in the liquid helium.

FIG. 7 shows another embodiment of the invention, which is different from the embodiment of FIG. 4 in that a casing 2 having the power circuit 11 and the voltmeter 10 is not fixedly secured to the measuring unit 3. One end of the base member 3b of the measuring unit 3 is associated with a connector 6 and the conductive wires 6a, 6b connected to the sensing element 8 at opposite sides thereof are connected to the power circuit 11 and the voltmeter 10, as shown in FIG. 2, through an electric cable 5 connecting the connector 6 and the casing 2.

What is claimed as new and desired to be secured by Letters Patent of the United States is:

1. A level gauge for liquid helium comprising:

a sensing element comprising a wire of a superconductive alloy which has a superconducting transition temperature, $T_c$, of 4.2° to 4.5° K.;

a support member for linearly supporting and dielectrically insulating said sensing element;

means for energizing said sensing element;

and means for detecting a current passed through the sensing element;

said superconductive alloy consisting essentially of zirconium, ruthenium and rhodium which are represented by a formula $Zr_{100-x} \cdot (Ru_y \cdot Rh_{1-1})_x$ in which x represents contents of at least one of said ruthenium and said rhodium in atomic % and in a numerical value of $22.5 \leq x \leq 27.5$ and y represents a numerical value of $0 \leq y \leq 1$, and superconductive alloy having an amorphous phase which is obtained when a molten alloy is rapidly quenched.

2. A level gauge according to claim 1, wherein said wire is a ribbon wire having a thickness of 10 to 30 $\mu m$ and a width of 0.2 to 0.5 mm.

3. A level gauge according to claim 1, wherein said support member is made of a metallic pipe and said sensing element is supported linearly and dielectrically insulated from the inside wall of said support member substantially over the entire length thereof along the axial direction of said support member.

4. A level gauge according to claim 3, wherein said support member is formed integrally and coaxially with a first end of a base member which is made of a metallic pipe, said sensing element is connected at opposite ends thereof to a first end of each of two electrical conductive wires, respectively, which are coated with insulating material and a second end of each of said conductive wires, respectively, is drawn out of said base member from a second end of said base member for electrically connecting said sensing element to a DC power supply.

5. A level gauge according to claim 4, wherein the second end of each of the conductive wires is connected to respective terminals of a battery; and a voltmeter is connected in parallel to said sensing element between the two conductive wires.

6. A level gauge according to claim 5, wherein said battery and said voltmeter are accomodated in a casing fixed to said second end of said base member.

7. A superconductive alloy for use in a sensing element for a level gauge capable of detecting a level of liquid helium, said alloy consisting essentially of $(100-x)$ atomic % of zirconium, $(x-y)$ atomic % of ruthenium and y atomic % of rhodium in which $22.5 \leq x \leq 27.5$ and $0 \leq y \leq x$, said alloy having an amorphous phase obtained by rapidly quenching a molten alloy material and having a superconducting transition temperature, Tc, of 4.2° to 4.5° K.

* * * * *

UNITED STATES PATENT AND TRADEMARK OFFICE
CERTIFICATE OF CORRECTION

PATENT NO. : 4,655,079
DATED : April 7, 1987
INVENTOR(S) : Tsuyoshi Masumoto, et al.

It is certified that error appears in the above-identified patent and that said Letters Patent is hereby corrected as shown below:

In the Abstract, line 10, delete "rapid" and insert therefor --rapidly--;

In column 1, line 7, delete "accomodated" and insert therefor --accommodated--;

In column 1, line 12, delete "rapid" and insert therefor --rapidly--;

In column 1, line 20, delete "makes" and insert therefor --make--;

In column 1, line 26, delete "rapid" and insert therefor --rapidly--;

In column 1, line 40, delete "accomodated" and insert

UNITED STATES PATENT AND TRADEMARK OFFICE
CERTIFICATE OF CORRECTION

PATENT NO. : 4,655,079
DATED : April 7, 1987
INVENTOR(S) : Tsuyoshi Masumoto, et al.

It is certified that error appears in the above-identified patent and that said Letters Patent is hereby corrected as shown below:

therefor --accommodated--;

In column 1, line 42, delete "D.C." and insert therefor --DC--;

In column 1, line 48, delete "$Zr_{80}.Nb_5 1.Al_8 Si_7$" and insert therefor --$Zr_{80}.Nb_5.Al_8 Si_7$--;

In column 1, line 64, delete "temperature Tc," and insert therefor --temperature, Tc,--;

In column 1, line 68, delete "made the" and insert therefor --made, the--;

In column 2, line 1, delete "wire" and insert therefor --wires--;

In column 2, line 33, delete "$T_c$ caused" and insert therefor --$T_c$, caused--;

UNITED STATES PATENT AND TRADEMARK OFFICE
CERTIFICATE OF CORRECTION

PATENT NO. : 4,655,079
DATED : April 7, 1987
INVENTOR(S) : Tsuyoshi Masumoto, et al.

It is certified that error appears in the above-identified patent and that said Letters Patent is hereby corrected as shown below:

In column 2, line 33, delete "conditons" and insert therefor --conditions--;

In column 2, line 53, delete "represent" and insert therefor --represents--;

In column 3, line 5, delete "$T_c$" and insert therefor --Tc--;

In column 3, line 9, delete "current" and insert therefor --circuit--;

In column 3, line 10, delete "gage" and insert therefor --gauge--;

In column 3, line 35, delete "represents" and insert therefor --represent--;

UNITED STATES PATENT AND TRADEMARK OFFICE
CERTIFICATE OF CORRECTION

PATENT NO. : 4,655,079
DATED : April 7, 1987
INVENTOR(S) : Tsuyoshi Masumoto, et al.

It is certified that error appears in the above-identified patent and that said Letters Patent is hereby corrected as shown below:

In column 3, line 49, after "shown" insert therefor --in--;

In column 4, line 15, delete "elements" and insert therefor --elements,--;

In column 4, line 55, delete "an" and insert therefor --a--;

In column 5, line 4, delete "the" (second occurrence);

In column 5, line 7, delete "gages" and insert therefor --gauges--;

In column 5, line 26, delete "priciple" and insert therefor --principle--;

In column 5, line 51, delete "accomodated" and insert

UNITED STATES PATENT AND TRADEMARK OFFICE
CERTIFICATE OF CORRECTION

PATENT NO. : 4,655,079
DATED : April 7, 1987
INVENTOR(S) : Tsuyoshi Masumoto, et al.

It is certified that error appears in the above-identified patent and that said Letters Patent is hereby corrected as shown below:

therefor --accommodated--;

In column 6, line 4, delete "accomodating" and insert therefor --accommodating--;

In column 6, line 24, delete "extend" and insert therefor --extends--;

In column 6, line 43, delete "and";

In column 6, line 49, delete "accomodating" and insert therefor --accommodating--;

In column 6, line 51, delete "perpendicular" and insert therefor --vertical--;

In column 7, line 3, delete "$T_c$" and insert therefor --$T_c$--;

UNITED STATES PATENT AND TRADEMARK OFFICE
CERTIFICATE OF CORRECTION

PATENT NO. : 4,655,079
DATED : April 7, 1987
INVENTOR(S) : Tsuyoshi Masumoto, et al.

It is certified that error appears in the above-identified patent and that said Letters Patent is hereby corrected as shown below:

In column 8, line 17, delete "accomodated" and insert therefor --accommodated--.

Signed and Sealed this

Tenth Day of May, 1988

*Attest:*

DONALD J. QUIGG

*Attesting Officer*   *Commissioner of Patents and Trademarks*